(12) United States Patent
Uemura

(10) Patent No.: US 6,917,059 B2
(45) Date of Patent: Jul. 12, 2005

(54) III GROUP NITRIDE SYSTEM COMPOUND SEMICONDUCTOR LIGHT EMITTING ELEMENT

(75) Inventor: Toshiya Uemura, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 23 days.

(21) Appl. No.: 10/694,760

(22) Filed: Oct. 29, 2003

(65) Prior Publication Data

US 2004/0129948 A1 Jul. 8, 2004

(30) Foreign Application Priority Data

Oct. 31, 2002  (JP) ........................................ 2002-317746

(51) Int. Cl.$^7$ .............................................. H01L 33/00
(52) U.S. Cl. .................... 257/103; 257/103; 257/622
(58) Field of Search ............................ 257/103, 13, 14, 257/96, 622, 614, 627, 631

(56) References Cited

U.S. PATENT DOCUMENTS 6,376,866 B1 * 4/2002 Shakuda ................... 257/103

FOREIGN PATENT DOCUMENTS

JP    2001-267242    9/2001

OTHER PUBLICATIONS

Kazuyuki Tadatomo, et al., "High Output Power InGaN Ultraviolet Light–Emitting Diodes Fabricated on Patterned Substrates Using Metalorganic Vapor Phase Epitaxy", Japanese Journal Appl. Phys. vol. 40., Part 2, No. 6B, Jun. 15, 2001, pp. L583–585.

* cited by examiner

Primary Examiner—David Nelms
Assistant Examiner—Thinh T Nguyen
(74) Attorney, Agent, or Firm—McGinn & Gibb, PLLC

(57) ABSTRACT

A III group nitride system compound semiconductor light emitting element has: a transparent substrate with a concave portion on the surface; a filling material that is embedded in the concave portion; and a III group nitride system compound semiconductor layer that is formed on the surface of the transparent substrate. The filling material has a refractive index substantially equal to that of the III group nitride system compound semiconductor layer or closer to that of the III group nitride system compound semiconductor layer than that of the transparent substrate.

4 Claims, 3 Drawing Sheets

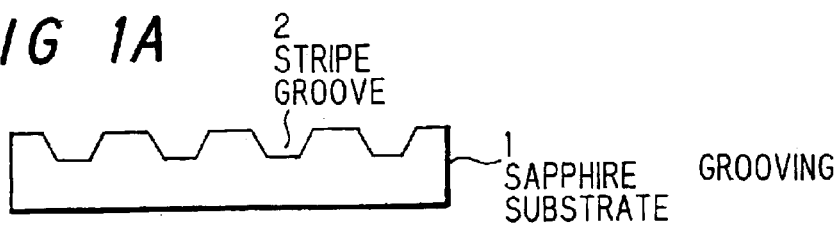
FIG. 1A   GROOVING
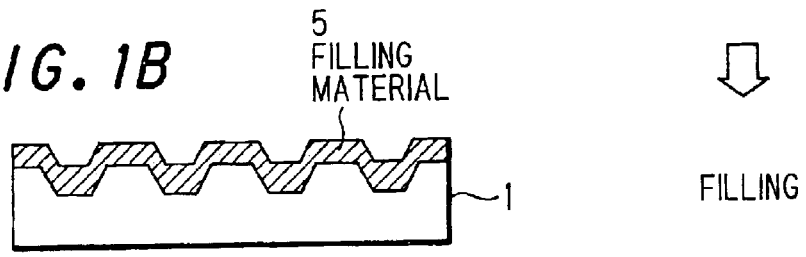
FIG. 1B   FILLING
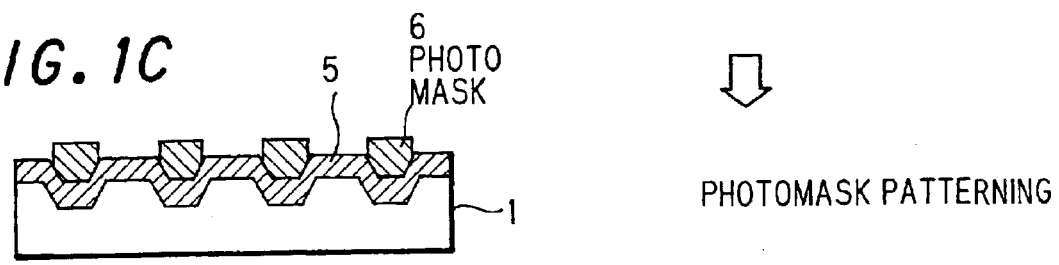
FIG. 1C   PHOTOMASK PATTERNING
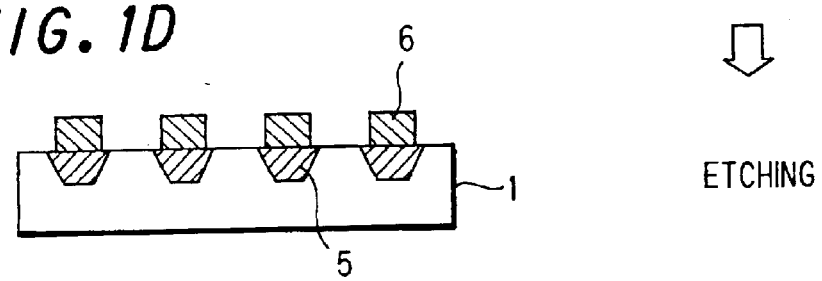
FIG. 1D   ETCHING
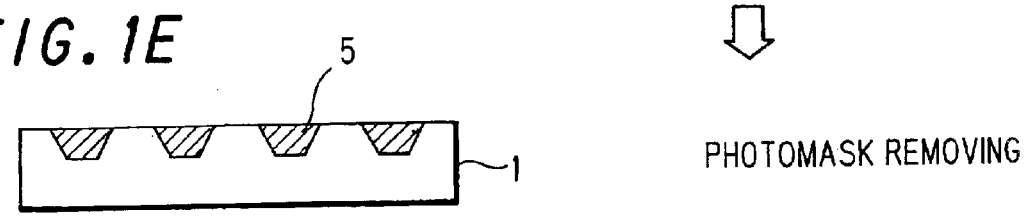
FIG. 1E   PHOTOMASK REMOVING
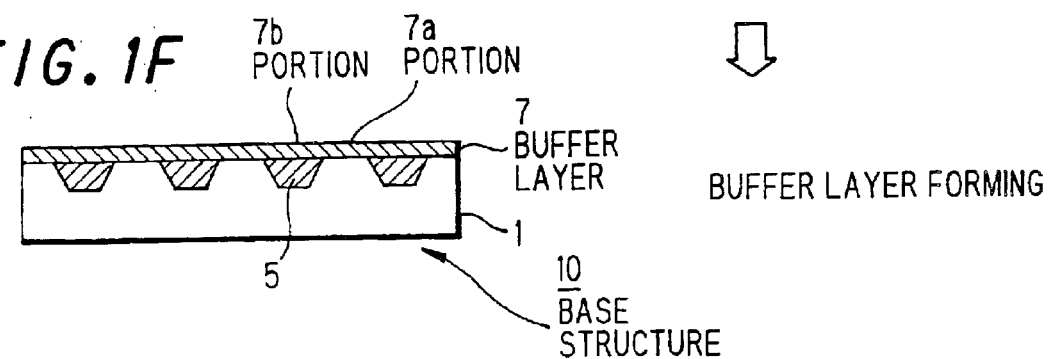
FIG. 1F   BUFFER LAYER FORMING

III GROUP NITRIDE SYSTEM COMPOUND SEMICONDUCTOR LIGHT EMITTING ELEMENT

The present application is based on Japanese patent application No. 2002-317746, the entire contents of which are incorporated herein by reference.

BACKGROUND OF THE INVENTION

1. Field of the Invention

This invention relates to improvement in III group nitride system compound semiconductor light emitting element.

2. Description of the Related Art

Conventionally, in making the III group nitride system compound semiconductor light emitting element (hereinafter also referred to simply as light emitting element), III group nitride system compound semiconductor layer is grown on the mirror-finished surface of a sapphire substrate through buffer layer. Critical angle at the interface of sapphire substrate and III group nitride system compound semiconductor layer is no more than about 47 degree because there is a big difference in refractive index therebetween. Therefore, some component of light emitted from the III group nitride system compound semiconductor layer can be returned to the semiconductor layer while being subjected to total reflection at the interface. Light returned to the semiconductor layer is attenuated due to scattering or absorption in crystal of the semiconductor layer. Thus, the big difference in refractive index between sapphire substrate and III group nitride system compound semiconductor layer prevents light emitted from III group nitride system compound semiconductor layer from being taken out efficiently.

So, it is suggested to form a pattern an the surface of sapphire substrate (Japanese patent application laid-open No. 2001-267242, Kazuyuki Tadatomo et al., "High output Power Ingan Ultraviolet Light-Emitting Diodes Fabricated on Patterned Substrates Using Metalorganic Vapor Phase Epitaxy"). For example, Japanese patent application laid-open No. 2001-267242 discloses to form a pattern of ridges and grooves (depth. 1.5 $\mu$m) of 3 $\mu$m wide respectively on sapphire substrate by photolithography. Thereby, light entered at a big angle into the interface of sapphire substrate and III group nitride system compound semiconductor layer can be taken out from the sidewall of groove to enhance the light extraction efficiency.

On the other hand, by patterning the surface of substrate, the lateral growth of III group nitride system compound semiconductor layer based on the sidewall of groove can be promoted. This prevents penetrating crystal transition in the vertical direction of III group nitride system compound semiconductor layer from occurring. Therefore, the crystal quality can be enhanced.

However, from the research of the inventor, it is found that it is difficult to promote uniformly the lateral growth on the entire surface of wafer even if the entire surface of wafer is patterned. Namely, it is difficult to grow III group nitride system compound semiconductor layer with a good crystal quality on the entire surface of wafer. As a result, the patterning of substrate causes a reduction in yield and an increase in the manufacturing cost of light emitting element.

Further, when III group nitride system compound semiconductor layer is grown in the groove formed by patterning, a cavity may be generated in the groove (Japanese patent application laid-open No. 2001-267242) In this case, there occurs a big difference in refractive index between the cavity and III group nitride system compound semiconductor layer. Therefore, light emitted from III group nitride system compound semiconductor layer will be reflected on the wall of cavity. As a result, the light extraction efficiency lowers.

SUMMARY OF THE INVENTION

It is an object of the invention to provide a light emitting element that has III group nitride system compound semiconductor layer with a good crystal quality grown on the entire surface of substrate without lowering the light extraction efficiency.

It is a further object of the invention to provide a method of making a light emitting element that has III group nitride system compound semiconductor layer with a good crystal quality grown on the entire surface of substrate without lowering the light extraction efficiency.

According to the invention, a III group nitride system compound semiconductor light emitting element, comprises:

a transparent substrate with a concave portion on the surface, the transparent substrate being of a material except for III group nitride system compound semiconductor;

a filling material that is embedded in the concave portion; and a III group nitride system compound semiconductor layer that is formed on the surface of the transparent substrate;

wherein the filling material has a refractive index substantially equal to that of the III group nitride system compound semiconductor layer or closer to that of the III group nitride system compound semiconductor layer than that of the transparent substrate.

According to the invention, a method of making a III group nitride system compound semiconductor light emitting element, comprises the steps of:

providing a transparent substrate with a concave portion on the surface;

embedding a filling material in the concave portion;

forming a buffer layer on the surface of the transparent substrate; and forming a III group nitride system compound semiconductor layer on the buffer layer;

wherein the filling material has a refractive index substantially equal to that of the III group nitride system compound semiconductor layer or closer to that of the III group nitride system compound semiconductor layer than that of the transparent substrate.

In the invention, the concave portion formed on the surface of substrate is filled with filling material and, therefore, no cavity is generated in the concave portion. Also, the refractive index of filling material is substantially equal to or close to that of III group nitride system compound semiconductor layer. Therefore, of light emitted from III group nitride system compound semiconductor layer, substantially all light components to reach the concave portion transmit through the filling material embedded in the concave portion, then transmitting through the sidewall and bottom of concave portion to be taken out from the chip. Thus, the light extraction efficiency can be enhanced.

Further, by filling the concave portion with the filling material, the flatness of substrate can be obtained. Therefore, III group nitride system compound semiconductor layer with a good crystal quality can be grown on the entire surface of wafer.

BRIEF DESCRIPTION OF THE DRAWINGS

The preferred embodiments according to the invention will be explained below referring to the drawings, wherein:

FIGS. 1A to 1F are cross sectional views showing a method of making a light emitting element in a preferred embodiment according to the invention;

DETAILED DESCRIPTION OF THE PREFERRED EMBODIMENTS

Figure 2:
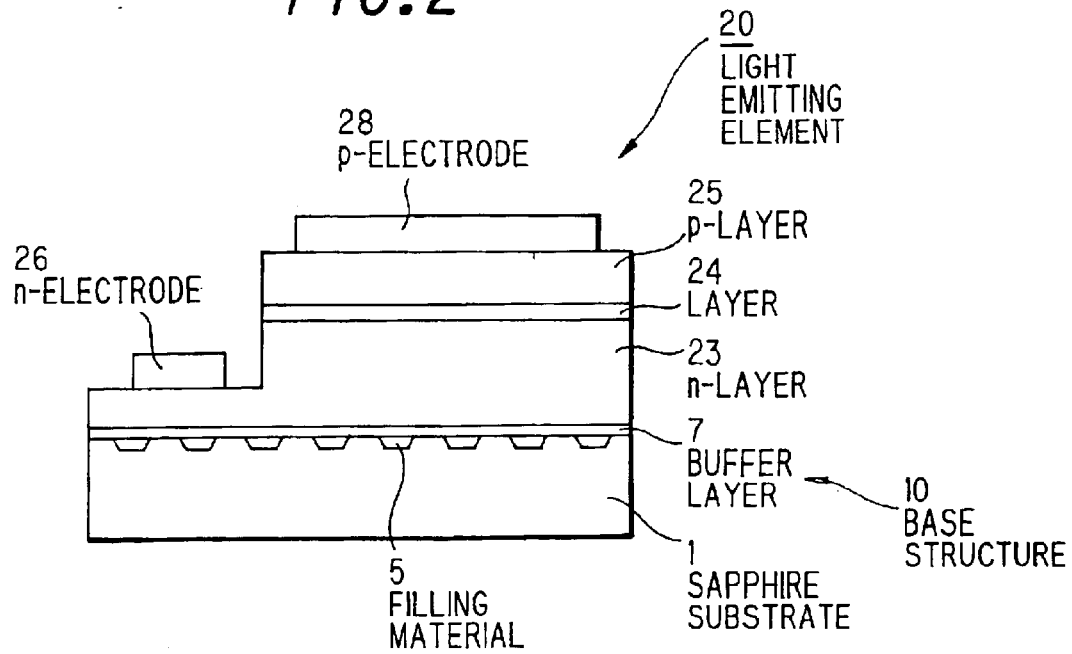
FIG. 2 is a schematic cross sectional view showing the structure of light emitting element 20 in the preferred embodiment according to the invention.

Components to be used for a light emitting element in the preferred embodiment according to the invention are explained below.

[Substrate]

A substrate used in the embodiment is not limited if it can transmit light emitted from III group nitride system compound semiconductor layer and allows III group nitride system compound semiconductor layer to be grown on the substrate. For example, it may be of sapphire, spinel, zirconium boride, silicon carbide, zinc oxide, magnesium oxide, manganese oxide etc. Especially, sapphire substrate is preferable and a-face of sapphire substrate is further preferable.

Meanwhile, with respect to a substrate of III group nitride system compound semiconductor layer, the crystal quality of semiconductor layer and the difference of refractive index do not matter since the substrate and semiconductor layer are of the same material. Therefore, the substrate of III group nitride system compound semiconductor layer is eliminated from the invention.

The substrate has concave portions, which form an uneven pattern, on the surface. The uneven pattern may be in arbitrary form such as stripe, lattice, spots etc. The pattern pitch is made to be 0.1 to 10 $\mu$m, the depth (difference of top and bottom levels) of concave portion is made to be about 0.1 to 5 $\mu$m. The uneven pattern is formed on the entire surface of wafer. The uneven pattern may be formed by etching, dicing etc.

[III Group Nitride System Compound Semiconductor Layer]

III group nitride system compound semiconductor layer of light emitting element in the embodiment is represented by a general formula, $Al_xGa_yIn_{1-x-y}N$ ($0 \leq X \leq 1$, $0 \leq y \leq 1$, $0 \leq x+y \leq 1$) and includes a two-element system compound of AlN, GaN and InN and a three-element system compound of $Al_xGa_{1-x}N$. $Al_xIn_{1-x}N$ and $Ga_yIn_{1-y}N$ ($0<x<1$). Part of III group element may be replaced by boron (B), thallium (Tl) etc. and part of nitrogen (N) may be replaced by phosphorus (P), arsenic (As), antimony (Sb), bismuth (Bi) etc. The light emitting element of the invention is fabricated laminating such III group nitride system compound semiconductor layer. The structure of light emitting element may include quantum well (multiquantum well or single quantum well) of III group nitride system compound semiconductor layer and may be of single-hetero type, double-hetero type or homo junction type.

III group nitride system compound semiconductor layer may include arbitrary dopant. For example, n-type impurity available is silicon (Si), germanium (Ge), selenium (se), tellurium (Te), carbon (C) etc. p-type impurity available is magnesium (Mg), zinc (Zn), beryllium (Be), calcium (Ca), strontium (sr), barium (Ba) etc. III group nitride system compound semiconductor layer of light emitting element in the embodiment is formed by using molecular beam epitaxy (MBE), hydride vapor phase epitaxy (HVPE), sputtering, ion plating etc. other than MOCVD.

[Filling Material]

Filling material used in the embodiment has a refractive index substantially equal to that of III group nitride system compound semiconductor layer or a refractive index closer to that of III group nitride system compound semiconductor layer than that of the transparent substrate. When sapphire is selected as the transparent substrate, it is preferred that the filling material is at least one selected from the group of $CeO_2$, $TiO_2$, $Nd_2O_3$, $Ta_2O_5$, $ZrO_2$ and III group nitride system compound semiconductor.

If the refractive index of filled material is closer to that of transparent substrate than that of III group nitride system compound semiconductor layer, light emitted from the semiconductor layer must be reflected on the surface of filled material as is on the surface of substrate. As a result, it is spoiled to form the uneven pattern on substrate to enhance the light extraction efficiency.

The method of embedding the filling material in the concave portions is, though it may be suitably chosen depending on material, sputtering, deposition, spin coating, CVD etc.

It is preferred that the concave portions are completely filled with filling material such that the surface of filled material is at a level substantially equal to the top surface of substrate. Thereby, the flatness of surface in substrate can be obtained. Therefore, III group nitride system compound semiconductor layer with a good crystal quality can be grown on the entire surface of wafer.

[Embodiments of Light Emitting Element]

FIGS. 1A to 1P are cross sectional views showing a method of making a light emitting element in the preferred embodiment according to the invention.

At first, as shown in FIG. 1A, stripe grooves 2 are formed on a sapphire substrate 1 by etching. The stripe groove 2 has a width of 3 $\mu$m, a pitch of 6 $\mu$m and a depth of 2.5 $\mu$m. Next, as shown in FIG. 1B, layer of filling material 5 is formed on the surface of sapphire substrate 1 by sputtering The filling material 5 layer has the same thickness as the stripe groove 2. In this embodiment, the filling material 5 is of $CeO_2$.

Then, as shown in FIG. 1C, a pattern of photomask 6 is formed on the stripe grooves 2 in filling material 5 layer. Then, as shown in FIG. 1D, exposed part of filling material 5 is removed by etching. Then, as shown in FIG. 1E, photomask 6 is removed.

Thus, as shown in FIG. 1E, the stripe groove 5 is filled with filling material 5 and the entire surface of sapphire substrate 1 is flattened.

Then, as shown in FIG. 1F, buffer layer 7 of AlN is formed on the sapphire substrate 1 with filling material 5 on the surface by the MOCVD method to obtain a base structure 10.

With respect to the buffer layer 7, portion 7a located on the sapphire substrate 1 can be a growth base point of III group nitride system compound semiconductor layer to be formed on the portion 7a. However, portion 7b located on the filling material 5 of $CeO_2$ cannot be such a growth base point since it has different crystal form of buffer layer. Therefore, III group nitride system compound semiconductor layer to be grown on the portion 7a located on the sapphire substrate 1 is grown to cover the portion 7b located on the filling material 5. So, penetrating crystal transition in the vertical direction can be prevented, and the crystal quality of III group nitride system compound semiconductor layer can be enhanced.

FIG. 2 is a schematic cross sectional view showing the structure of light emitting element 20 in the preferred embodiment according to the invention.

Using the base structure 10 thus obtained, the light emitting element 20 shown in FIG. 2 is fabricated. The details of layers of the light emitting element 20 are as follows:

| Layer: | Composition |
|---|---|
| p-type layer 25: | p-GaN:Mg |
| layer 24 including light emitting layer: | InGaN layer included |
| n-type layer 23: | n-GaN:Si |
| buffer layer 7: | AlN |
| substrate 1: | sapphire |

The light emitting element 20 thus composed is fabricated as follows.

At first, with the base structure 10 shown in FIG. 10 being continuously placed in the MOCVD apparatus used to form the buffer layer 7, n-type layer 23, layer 24 including light emitting layer and p-type layer 25 are sequentially grown by the MOCVD method. In this growth step, ammonia gas and alkyl compound gas of III group element, such as trimethylgallium (TMG), trimethylaluminum (TMA) and trimethylindium (TMI), are supplied onto the substrate (base structure 10) being heated at a given temperature to conduct thermal decomposition reaction. Thereby, desired crystal layers are formed on the substrate.

Next, using a mask of Ti/Ni, part of p-type layer 25, layer 24 and n-type layer 23 is removed by reactive ion etching to expose part of n-type layer 23 where to form the n-electrode pad 26.

Further, photoresist is coated on the entire surface of semiconductor layer, and photoresist on electrode-forming area in p-type layer 25 is then removed to expose the corresponding surface of p-type layer 25.

Then, p-electrode 28 of Rh is formed on the exposed p-type layer 25 by deposition. N-electrode 26 of Al and V layers is formed on the exposed n-type layer 26. Thereafter, they are alloyed by known method.

In case of face-up type light emitting element that opposing surface to the substrate is used as light-discharging surface, p-electrode and n-electrode are formed as next. First, photoresist is coated on the entire surface of semiconductor layer, and photoresist on electrode-forming area in p-type layer 25 is then removed to expose the corresponding surface of p-type layer 25. Then, Au—Co transparent electrode layer is formed on the exposed p-type layer 25 by deposition.

Then, p-electrode pad (not shown) of Au alloy and n-electrode pad of Al alloy are deposited.

In the light emitting element 20 thus formed, light emitted from the layer 24 including light emitting layer reaches the interface of sapphire substrate 1 and n-GaN layer 23 (i.e., buffer layer 7 is negligible due to having less than a thickness optically significant). On the surface of sapphire substrate 1, the stripe grooves 2 are densely filled with filled material 5 of $CeO_2$. The filled material 5 has a refractive index close to that of III group nitride system compound semiconductor and, therefore, the critical angle at the interface of sapphire substrate 1 and n-GaN layer 23 increases such that little light reflects on the interface. So, most of light reaching the filled material 5 transmits through the filled material 5, entering the stripe grooves 2. Of light entering the stripe grooves 2, light component that would be subjected to total reflection at the interface of sapphire substrate 1 and n-GaN layer 23 in case of the conventional interface condition without the stripe groove 2 transmits through the sidewall of stripe groove 2. On the other hand, of light entering the stripe grooves 2, light component that would transmit through in the direction of substrate 1 without being subjected to total reflection at the interface of sapphire substrate 1 and n-GaN layer 23 in case of the conventional interface condition without the stripe groove 2 transmits through the bottom surface of stripe groove 2. Thus, of light emitted from the layer 24 including light emitting layer, even light component with such an incident angle that would be reflected if the interface of sapphire substrate 1 and III group nitride system compound semiconductor layer were flat without stripe grooves 2 can transmit through the filled material 5 and then through the sidewall of stripe grooves 2 when the light component is entered to portion with filled material 5 formed on the substrate. Accordingly, the light extraction efficiency in the direction of substrate can be improved.

Especially in case of flip-chip type light emitting element, the improvement of light extraction efficiency in the direction of substrate is obviously advantageous. Also, in case of face-up type light emitting element, it is advantageous since the amount of light to be entered into the substrate increases, where the light is reflected on a silver paste used to adhere the substrate to an external supporting member such as a lead frame and then is discharged outside the chip. In addition, both flip-chip type and face-up type can have improved emission efficiency due to enhancement in crystal quality of III group nitride system compound semiconductor layer.

If necessary, the sapphire substrate 1 and buff r layer 7 may be removed after fabricating the light emitting element.

The buffer layer 7 may be of GaN, InN, AlGaN, InGaN, AlGaN etc. other then AlN.

The n-type layer 23 may be of AlGaN, InGaN or AlInGaN other than GaN.

The n-type layer 23 may include an n-type impurity of Ge, Se, Te, C etc. other than Si.

The n-type layer 23 may have a double layer structure composed of low electron-density n⁻ layer located on the side of layer 24 and high electron-density n⁺ layer on the side of buffer layer 7.

The layer 24 may include a quantum well type light emitting layer. The structure of light emitting element may be single-hetero type, double-hetero type or homo junction type.

The layer 24 may include a wide bandgap III group nitride system compound semiconductor layer with an acceptor such as Mg doped on the side of p-type layer 25. This layer prevents electrons injected into the layer 24 from diffusing in the p-type layer 25.

The p-type layer 25 of GaN with a p-type impurity, Mg doped is formed on the layer 24 including light emitting layer. The p-type layer 25 may be of AlGaN, InGaN or AlInGaN. The p-type impurity doped may be Zn, Be, Ca, Sr or Ba.

The p-type layer 25 may have a double layer structure composed of low hole-density p⁻ layer located on the side of layer 24 and high hole-density p⁺ layer on the side of p-electrode 28.

The III group nitride system compound semiconductor layer of light emitting element in the embodiment may be formed by using molecular beam epitaxy (MBE), hydride vapor phase epitaxy (HVPE), sputtering, ion plating etc. other than MOCVD.

Figure 3:
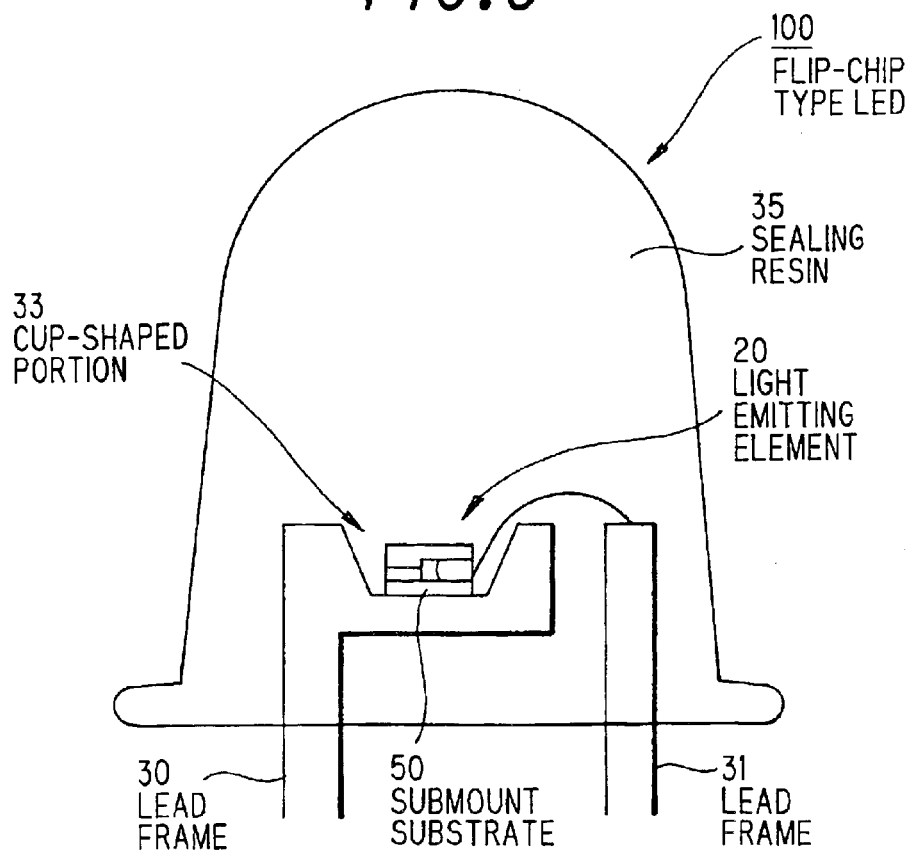
FIG. 3 is a schematic cross sectional view showing a light emitting diode 100 with the light emitting element 20 in the embodiment.

FIG. 3 is a schematic cross sectional view showing a light emitting diode 100 with the light emitting element 20 in the embodiment, The light emitting diode 100 is of flip-chip type and is composed of the light emitting element 20, lead frames 30, 31, a submount substrate 50 and sealing resin 35.

Figure 4:
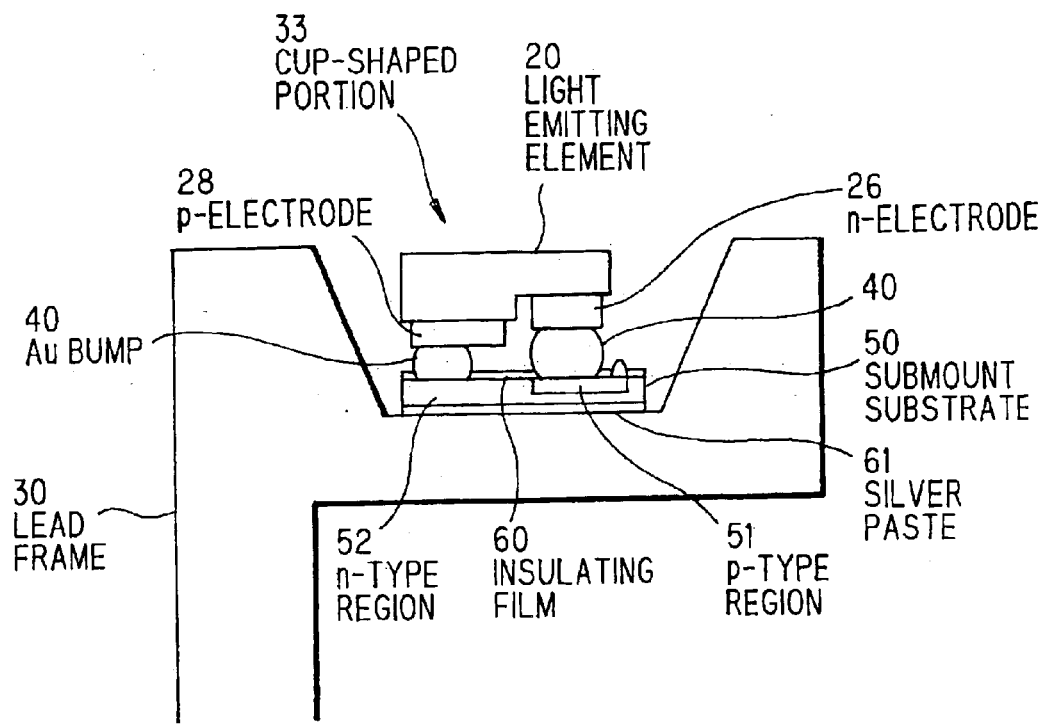
FIG. 4 is a partially enlarged cross sectional view showing the periphery of a cup-shaped portion 33 in FIG. 3

FIG. 4 is a partially enlarged cross sectional view showing the periphery of a cup-shaped portion 33 in FIG. 3. As shown in FIG. 4, the light emitting element 20 is mounted on the cup-shaped portion 33 of the lead frame 30 through the submount substrate 50. The submount substrate 50 has p-type region 51 and n-type region 52, and insulating film 60 of SiO2 is formed on its surface except for part where Au bumps 40 are mounted. As shown, by mounting the light emitting element 20 on the submount substrate 50 while turning the electrode side downward, the n-electrode 26 is connected through the Au bump 40 to the p-type region 51 of submount substrate 50 and the p-electrode 28 is connected through the Au bump 40 to the n-type region 52 of submount substrate 50. Thus, the p-electrode 28 and n-electrode 26 of light emitting element 20 are electrically connected to the p-type region 51 and n-type region 52, respectively, of submount substrate 50. The submount substrate 50 is fixedly adhered onto the cup-shaped portion 33 of lead frame 30 through silver paste 61 on the opposite side to the surface where the light emitting element 20 is mounted.

Figure 5:
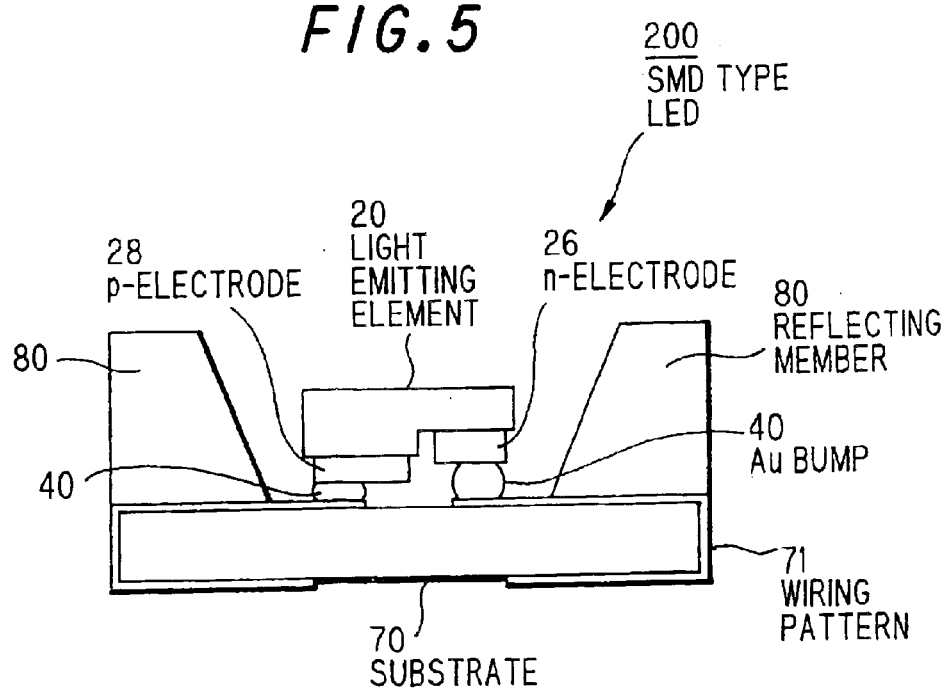
FIG. 5 is a schematic cross sectional view showing another light emitting diode 200 with the light emitting element 20 in a preferred embodiment according to the invention.

FIG. 5 is a schematic cross sectional view showing another light emitting diode 200 with the light emitting element 20 in the preferred embodiment according to the invention. The light emitting diode 200 is of surface mount device (SMD) type. In FIG. 5, like components of LED 100 are indicated by the same numerals.

LED 200 is composed of the light emitting element 20, a substrate 70 and reflecting member 80. Like LED 100, the light emitting element 20 is mounted on the substrate 70 while turning the electrode side downward. A wiring pattern 71 is formed on the surface of substrate 70, and the p-electrode 28 and n-electrode 26 of light emitting element 20 are adhered through the Au bumps to the wiring pattern 71 and, thereby, the electrodes of light emitting element 20 are electrically connected with the wiring pattern 71. The reflecting member 80 is positioned surrounding the light emitting element 20, the reflecting member 80 is of white resin and, on its surface, reflects light emitted from the light emitting element 20 at a high efficiency.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A III group nitride system compound semiconductor light emitting element, comprising:

a transparent substrate with a concave portion on the surface, the transparent substrate being of a material except for III group nitride system compound semiconductor;

a filling material that is embedded in the concave portion; and a III group nitride system compound semiconductor layer that is formed on the surface of the transparent substrate;

wherein the filling material has a refractive index substantially equal to that of the III group nitride system compound semiconductor layer or closer to that of the III group nitride system compound semiconductor layer than that of the transparent substrate.

2. The III group nitride system compound semiconductor light emitting element according to claim 1, wherein:

the filling material is embedded in the concave portion such that the surface of the embedded filling material is at a level substantially equal to the top surface of the transparent substrate.

3. The III group nitride system compound semiconductor light emitting element according to claim 1, wherein:

the transparent substrate is of sapphire and the filling material is at least one selected from the group of $CeO_2$, $TiO_2$, $Nd_2O_3$, $Ta_2O_5$, $ZrO_2$ and III group nitride system compound semiconductor.

4. A pretreated transparent substrate, comprising:

a transparent substrate with a concave portion on the surface, the transparent substrate being of a material except for III group nitride system compound semiconductor; and a filling material that is embedded in the concave portion;

wherein the filling material has a refractive index substantially equal to that of the III group nitride system compound semiconductor layer or closer to that of the III group nitride system compound semiconductor layer than that of the transparent substrate.

* * * * *